Sept. 22, 1959 D. A. BURT ET AL 2,905,885
GENERATOR VOLTAGE REGULATOR
Filed Nov. 21, 1957

WITNESSES:
Bernard R. Giegue
Robert C. Baird

INVENTORS
Donald A. Burt and
Robert I. Van Nice.
BY
F. E. Browder
ATTORNEY

United States Patent Office 2,905,885

Patented Sept. 22, 1959

2,905,885

GENERATOR VOLTAGE REGULATOR

Donald A. Burt, Franklin Township, Westmoreland County, and Robert I. Van Nice, Glenshaw, Pa., assignors to Westinghouse Electric Corporation, East Pittsburgh, Pa., a corporation of Pennsylvania

Application November 21, 1957, Serial No. 697,956

6 Claims. (Cl. 322—79)

This invention relates to voltage regulators in general and in particular to voltage regulators utilizing semiconductor diodes.

The advent of a semiconductor diode having such characteristics that on exceeding certain specified reverse current and voltage, the diode becomes highly conductive and thereafter will carry a substantial reverse current at low voltages, has led to new voltage regulator applications. The phenomenon described above is not a Zener breakdown, nor is it an avalanche breakdown. This unique breakdown characteristic can be repeated indefinitely. This breakdown has been designated as a hyperconductive breakdown, and a diode having such a characteristic will be referred to hereinafter as a hyperconductive diode.

Such a hyperconductive diode with controllable reversible breakdown characteristics or hyperconductive breakdown comprises a first base element which consists of a semiconductive member doped with an impurity to provide a first type of semiconductivity, either N or P. Upon this first base element is an emitter element consisting of semiconductive material doped with an opposite type of semiconductivity. This emitter element may be prepared by allowing a pellet containing a doping impurity to a wafer of semiconductive material forming the first base element. An emitter junction is present at the zone between the first base element and the emitter element.

In order to facilitate the connecting of the diode into an electrical circuit, a layer of silver or other good conductive metal may be fused, alloyed into or soldered with the upper surface of the emitter element. Copper lead wires may be readily soldered to this layer.

A second base element of opposite conductivity is provided next to the first base element. A zone where the first and second base elements meet forms a collector junction.

Next to the second base element is a mass-of-metal which is a source of carriers that play a critical part in the functioning of the diode. This mass-of-metal may be neutral or it may have the same doping characteristic as the second base element. This mass-of-metal may be applied to the second base element by a soldering, alloying, fusing or other similar well-known method.

Such a hyperconductive semiconductor diode is described in a copending application, Serial No. 642,743, entitled, "Semiconductor Diode," filed February 27, 1957, assigned to the same assignee as the present invention. For a more detailed description of the construction, characteristics and operation of such a hyperconductive diode reference is made to the above copending application, Serial No. 642,743.

It is an object of this invention to provide an improved voltage regulator.

It is a further object of this invention to provide an improved voltage regulator utilizing hyperconductive diodes for alternating-current or direct-current generators.

Futher objects of this invention will become apparent in the following description when taken in conjunction with the accompanying drawing. In said drawing, for illustrative purposes only, is shown a preferred embodiment of the invention.

The terminal voltage of an alternating-current generator must be regulated if it is desired to maintain constant voltage as load and environmental conditions are varied. The basic elements of a regulator are a sensing circuit to detect the existing terminal voltage, a reference voltage against which this is prepared, and an amplifier to amplify the difference signal to a level adequate to excite the field of the alternator. Desirable features of a good regulator include close regulation of the voltage, environmental resistance, good stability, and a fast transient recovery.

Figure 1:
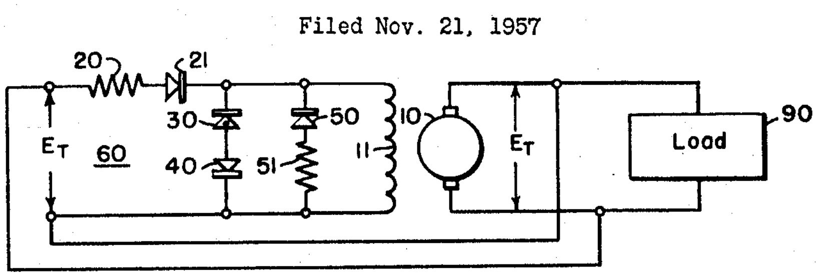
Figure 1 is a schematic diagram of an improved voltage regulator embodying the teachings of this invention.

Referring to Fig. 1, there is shown a schematic diagram of a voltage regulator embodying the teachings of this invention. In general, the apparatus illustrated in Fig. 1 comprises an alternating-current generator 10 having an excitation winding 11, a regulating circuit 60 and a load 90.

The regulating circuit 60 comprises a current limiting resistor 20, a rectifier 21 and the excitation winding 11 connected in series circuit relationship across the terminals of the alternating-current generator 10. A commutating rectifier 50 and a current limiting resistor 51 are connected across the excitation winding 11. A hyperconductive diode 30 and a rectifier 40 are connected back-to-back across the excitation winding 11.

Figures 2, 3, 4, 5:
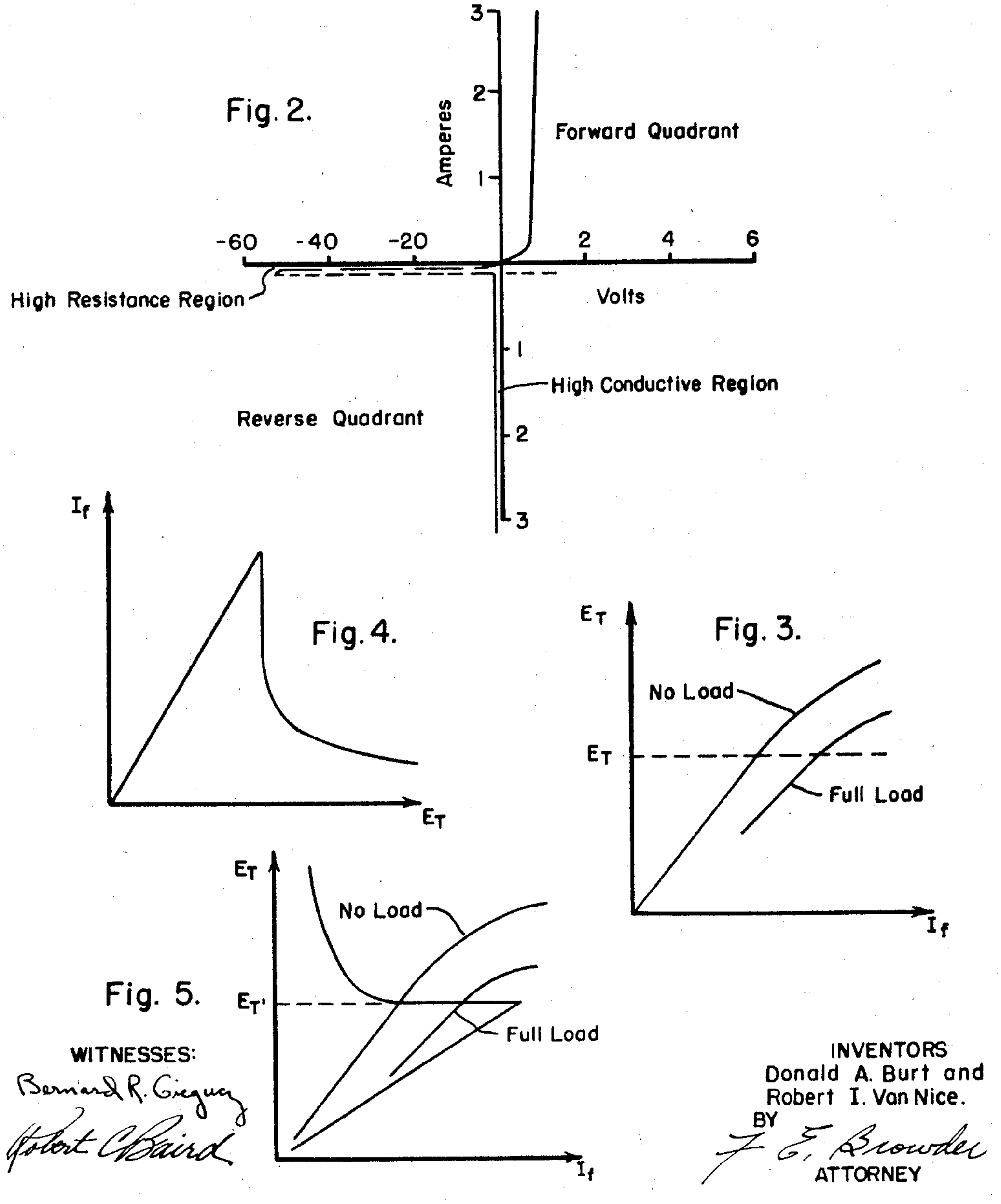
Fig. 2 is a diagram of a curve plotting the operation of a hyperconductive diode.
Fig. 3 is a graphical representation of the excitation requirements of the apparatus illustrated in Fig. 1.
Fig. 4 is a graphical representation of the average current supplied to the generator of Fig. 1 as a function of the generator voltage.
Fig. 5 is a graphical representation of the combined curves of Figs. 3 and 4.

The rectifier 21 rectifies the output of the alternating generator 10 and impresses a half-wave, pulsating direct-current voltage across the excitation winding 11, the commutating rectifier 50, and the back-to-back combination of the hyperconductive diode 30 and rectifier 40. Referring to Fig. 2, the graphical representation shows how the hyperconductive diode 30 responds to the application of different voltages. Considering the upper right or forward quadrant, when a forward voltage of the order of one voltage unit is applied, the current builds up to approximately three current units. When the voltage is reversed on the diode, it builds up in a reverse direction to approximately minus 55 voltage units with only a small fraction of a current unit of current flowing, and the hyperconductive diode 30 suddenly becomes highly conductive in a reverse direction, and the voltage drops to an approximately one voltage unit as shown in the lower left or reverse quadrant. Thus, the diode then becomes a conductor with low ohmic resistance and the current builds up rapidly to several amperes or current units.

As shown in the reverse quadrant in Fig. 2, when the hyperconductive diode 30 breaks down, the voltage drops along a substantially straight line to approximately one voltage unit, and very little power is dissipated in maintaining the hyperconductive diode 30 highly conductive in a reverse direction. The hyperconductive diode can be rendered highly resistant again by reducing the current below a maximum threshold value and the voltage below breakdown value. Consequently, the curve can be repeatedly followed as desired by properly controlling the magnitude of the reverse current and voltage.

The excitation requirements of the alternating-current generator 10 are represented graphically in Fig. 3 where the field current $I_f$ is plotted as a function of the terminal voltage $E_t$. Assuming for the moment that the field winding 11 can be considered to be a pure resistance, the average current $I_f$ supplied to it as a function of the terminal voltage $E_t$ is shown in Fig. 4. For low voltages, the current $I_f$ increases linearly as shown in Fig. 4. At the breakdown voltage of the hyperconductive diode 30, the field current $I_f$ suddenly drops by half, assuming a sinusoidal voltage, and for further increases in the terminal voltage $E_t$, the field current $I_f$ goes to zero asymptotically. The resistor 20 limits the current flow in the regulating circuit 60 when the hyperconductive diode 30 has broken down and is conducting.

In order to show the steady state performance of the regulating apparatus illustrated in Fig. 1, the Figures 3 and 4 can be combined as in Fig. 5. It can be seen that the generator voltage $E_t$, will be maintained throughout the load range since the intersection of the curves of "no load" and "full load" are at this level. Actually, assuming a sinusoidal terminal voltage $E_t$, the field current $I_f$ will alternate between maximum and half-maximum value, with an average value equal to the required excitation for a given load. Thus, the apparatus illustrated in Fig. 1 tends to maintain a terminal voltage level independent of load changes.

If we now consider actual field windings, which are inductive, it is necessary to have the rectifying diode 50 connected in shunt across the field winding 11 as a commutating or free-wheeling rectifier. A resistance 51 may be added in series with this commutator rectifier 50 to limit the value of the shunted current. The rectifier 40 is connected in a back-to-back manner with the hyperconductive diode 30 in order to block the flow of current in the forward direction through the hyperconductive diode 30.

Variation of the regulated voltage is accomplished by changing the hyperconductive diode 30 for a hyperconductive diode having a different breakdown voltage or by any well known means for varying the amount of feedback voltage and current to the regulator circuit 60. The same form of regulator can be used with an exciter-alternator combination such as is used in aircraft. This regulator may also be used for direct-current generators by adding means of chopping or pulsing the direct current being fed to the regulator so that the hyperconductive diode 30 has a chance to reset and again support voltage each cycle. In addition to the simplicity of the regulating circuit of this invention, the use of the hyperconductive diode confers the additional advantages of small size and weight and the reliability of a completely static device while satisfying the desirable features of a good regulator as hereinbefore described.

In conclusion, it is pointed out that while the illustrated example constitutes a practical embodiment of our invention, we do not limit ourselves to the exact details shown, since modification of the same may be varied without departing from the spirit of this invention.

We claim as our invention:

1. In a voltage regulating circuit, in combination, electric generator means having excitation winding means and output voltage means, coupling means for producing a flow of pulsating direct-current through said excitation winding means coupling said excitation winding means and said output voltage means of said generator means, and hyperconductive diode means connected in parallel with said excitation winding means, said hyperconductive diode means being polarized to oppose the flow of said pulsating direct current, said hyperconductive diode means having a controllable reversible breakdown characteristic, said characteristic allowing a large reverse current flow at low voltage after a breakdown voltage across said diode means has been attained.

2. In a voltage regulating circuit, in combination, electric generator means having excitation winding means and output voltage means, coupling means for producing a flow of pulsating direct-current through said excitation winding means coupling said excitation winding means and said output voltage means of said generator means, said coupling means including current limiting means, and hyperconductive diode means connected in parallel with said excitation winding means, said hyperconductive diode means being polarized to oppose the flow of said pulsating direct current, said hyperconductive diode means having a controllable reversible breakdown characteristic, said characteristic allowing a large reverse current flow at low voltage after a breakdown voltage across said diode means has been attained.

3. In a voltage regulating circuit, in combination, electric generator means having excitation winding means and output voltage means, coupling means for producing a flow of pulsating direct-current through said excitation winding means coupling said excitation winding means and said output voltage means of said generator means, said coupling means comprising rectifying means and current limiting means, and hyperconductive diode means connected in parallel with said excitation winding means, said hyperconductive diode means being polarized to oppose the flow of said pulsating direct current, said hyperconductive diode means having a controllable reversible breakdown characteristic, said characteristic allowing a large reverse current flow at low voltage after a breakdown voltage across said diode means has been attained.

4. In a voltage regulating circuit, in combination, electric generator means having excitation winding means and output voltage means, coupling means for producing a flow of pulsating direct-current through said excitation winding means coupling said excitation winding means and said output voltage means of said generator means, commutating rectifier means connected across said excitation winding means, and hyperconductive diode means connected in parallel with said excitation winding means, said hyperconductive diode means being polarized to oppose the flow of said pulsating direct current, said hyperconductive diode means having a controllable reversible breakdown characteristic, said characteristic allowing a large reverse current flow at low voltage after a breakdown voltage across said diode means has been attained.

5. In a voltage regulating circuit, in combination, electric generator means having excitation winding means and output voltage means, coupling means for producing a flow of pulsating direct current through said excitation winding means coupling said excitation winding means and said output voltage means of said generator means, said coupling means comprising rectifying means and current limiting means, commutating rectifier means connected across said excitation winding means, and hyperconductive diode means connected in parallel with said excitation winding means, said hyperconductive diode means being polarized to oppose the flow of said pulsating direct current, said hyperconductive diode means having a controllable reversible breakdown characteristic, said characteristic allowing a large reverse current flow at low voltage after a breakdown voltage across said diode means has been attained.

6. In a voltage regulating circuit, in combination, electric generator means having excitation winding means and output voltage means, coupling means for producing a flow of pulsating direct-current through said excitation winding means coupling said excitation winding means and said output voltage means of said generator means, said coupling means comprising rectifying means and current limiting means, commutating rectifier means connected across said excitation winding means, and hyperconductive diode means connected in parallel with said excitation winding means, said hyperconductive diode means being polarized to oppose the flow of said pulsating direct current, said hyperconductive diode means having a controllable reversible breakdown characteristic, said characterstic allowing a large reverse current flow at low voltage after a breakdown voltage across said diode means has been attained, said hyperconductive diode means having rectifying means serially connected therewith whereby current flow through said hyperconductive diode means in a forward direction is prevented.

References Cited in the file of this patent

UNITED STATES PATENTS

| | | |
|---|---|---|
| 1,855,736 | White | Apr. 26, 1932 |
| 1,870,064 | Nickle | Aug. 2, 1932 |
| 2,076,962 | O'Hagan | Apr. 13, 1937 |
| 2,773,233 | Marcks | Dec. 4, 1956 |